United States Patent
Kanou et al.

(10) Patent No.: US 9,081,284 B2
(45) Date of Patent: Jul. 14, 2015

(54) METHOD OF MANUFACTURING FORMING CONDUCTIVE LINE PATTERN IN BOUNDARY REGION

(71) Applicant: CANON KABUSHIKI KAISHA, Tokyo (JP)

(72) Inventors: Taikan Kanou, Kawasaki (JP); Masaru Fujimura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/772,440

(22) Filed: Feb. 21, 2013

(65) Prior Publication Data
US 2013/0221515 A1 Aug. 29, 2013

(30) Foreign Application Priority Data

Feb. 29, 2012 (JP) ................................ 2012-044300

(51) Int. Cl.
*H01L 21/302* (2006.01)
*G03F 7/20* (2006.01)
*H01L 23/48* (2006.01)

(52) U.S. Cl.
CPC .............. *G03F 7/2022* (2013.01); *H01L 23/48* (2013.01); *H01L 2924/0002* (2013.01)

(58) Field of Classification Search
CPC ........ H01L 21/027; H01L 21/03; H01L 23/48
USPC ................................................. 438/584–674
See application file for complete search history.

(56) References Cited

U.S. PATENT DOCUMENTS

| | | | |
|---|---|---|---|
| 5,635,316 A * | 6/1997 | Dao .................................. | 430/5 |
| 6,146,796 A * | 11/2000 | Kim ................................ | 430/30 |
| 7,256,873 B2 * | 8/2007 | Finders et al. .................. | 355/77 |
| 2007/0231715 A1 * | 10/2007 | Han et al. .......................... | 430/5 |
| 2009/0155933 A1 | 6/2009 | Ohara et al. ..................... | 438/14 |
| 2010/0104983 A1 * | 4/2010 | Ishibashi et al. .............. | 430/312 |
| 2013/0032956 A1 | 2/2013 | Kanou ......................... | 257/797 |

FOREIGN PATENT DOCUMENTS

| | | |
|---|---|---|
| JP | 10-010702 | 1/1998 |
| JP | 2009-049161 | 3/2009 |
| JP | 2009-145681 | 7/2009 |

* cited by examiner

*Primary Examiner* — Evan Pert
*Assistant Examiner* — Herve Assouman
(74) *Attorney, Agent, or Firm* — Fitzpatrick, Cella, Harper & Scinto

(57) ABSTRACT

A method of manufacturing a semiconductor device including a first region and a second region contacting the first region along a boundary line, includes forming a pattern having an on-boundary-line line portion with a width defined by a first line which is arranged in the first region and is parallel to the boundary line, and a second line which is arranged in the second region and is parallel to the boundary line. The forming the pattern includes independently performing, for a photoresist applied on a substrate, first exposure for defining the first line, and second exposure for defining the second line, and developing the photoresist having undergone the individually performing the first exposure and the second exposure.

7 Claims, 8 Drawing Sheets

METHOD OF MANUFACTURING FORMING CONDUCTIVE LINE PATTERN IN BOUNDARY REGION

BACKGROUND OF THE INVENTION

1. Field of the Invention

The present invention relates to a semiconductor device and a method of manufacturing the same.

2. Description of the Related Art

A method of exposing a plurality of divided regions using a plurality of photomasks (reticles) to form a pattern in one layer is available. Such a method will be referred to as dividing exposure hereinafter. Japanese Patent Laid-Open No. 10-010702 discloses a method of performing exposure so that parts of two divided patterns complement each other on their boundary portion.

In dividing exposure, a shift in pattern may occur between adjacent divided regions. Therefore, an error may occur in the space between a line in one divided region, and a line arranged in another divided region so as to be adjacent to the former line portion. This may cause a variation in capacitance between lines in the boundary region between adjacent divided regions. When this variation increases, a difference may occur between a signal transmitted via a line arranged in a region other than the boundary region, and a signal transmitted via a line arranged in the boundary region. When, for example, the error of the capacitance between lines in the boundary region of a solid-state image sensor manufactured by dividing exposure is large, it is difficult to obtain a uniform image.

SUMMARY OF THE INVENTION

The present invention provides a technique advantageous in terms of reducing a manufacturing error of the capacitance between lines in a boundary region.

One of aspects of the present invention provides a method of manufacturing a semiconductor device including a first region and a second region contacting the first region along a boundary line, the method comprising forming a pattern including an on-boundary-line line portion with a width defined by a first line which is arranged in the first region and is parallel to the boundary line, and a second line which is arranged in the second region and is parallel to the boundary line, the forming the pattern including individually performing, for a photoresist applied on a substrate, first exposure for defining the first line, and second exposure for defining the second line, and developing the photoresist having undergone the individually performing the first exposure and the second exposure.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. In the following exemplary embodiments, a direction of a boundary line extends along a vertical direction in a plan view of a semiconductor device and the boundary line is only one. However, the direction of the boundary line can be defined as extending along any direction such as a horizontal direction in the plan view, and the number of the boundary lines can be more than one.

Figure 1A:
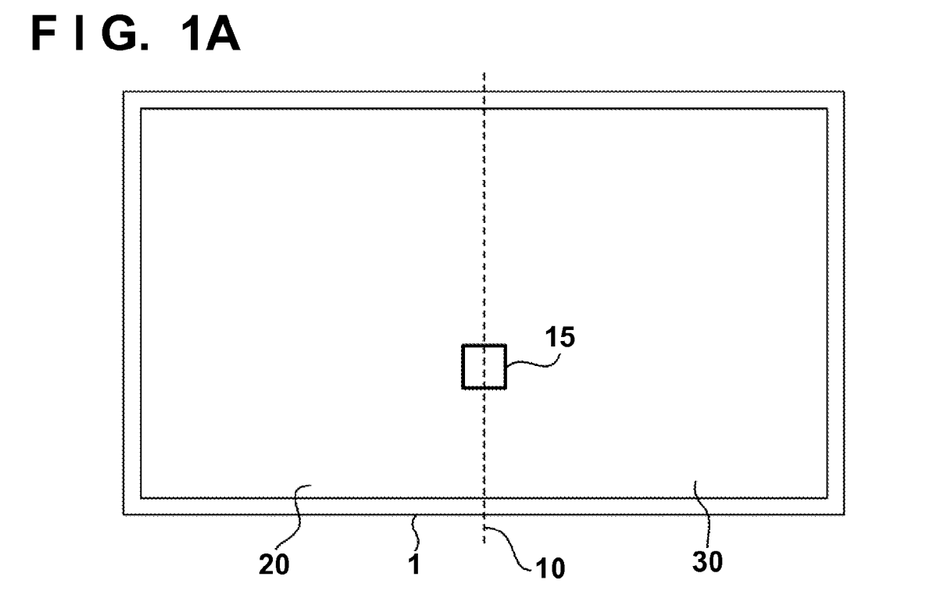
FIGS. 1A and 1B are plan views illustrating the configuration of a semiconductor device according to the first embodiment.

The first embodiment will be described with reference to FIGS. 1A, 1B, 2A, 2B, 3A to 3C, 4, and 7A to 7C. FIG. 1A is a plan view showing the configuration of a semiconductor device (for example, a semiconductor chip) 1 according to the first embodiment of the present invention. The semiconductor device 1 includes, as a plurality of regions, a first region 20 and second region 30 which are adjacent to each other on a boundary line 10. The first region 20 contacts the second region 30 along the boundary line 10. The first region 20 is exposed using a first photomask PM1 in a photolithography step for manufacturing the semiconductor device 1. The second region 30 is exposed using a second photomask PM2 in the photolithography step. Note that the first photomask PM1 and second photomask PM2 may be formed on different members or in different regions on one member. The semiconductor device 1 can be implemented by, for example, a solid-state image sensor or a memory.

Figure 8:
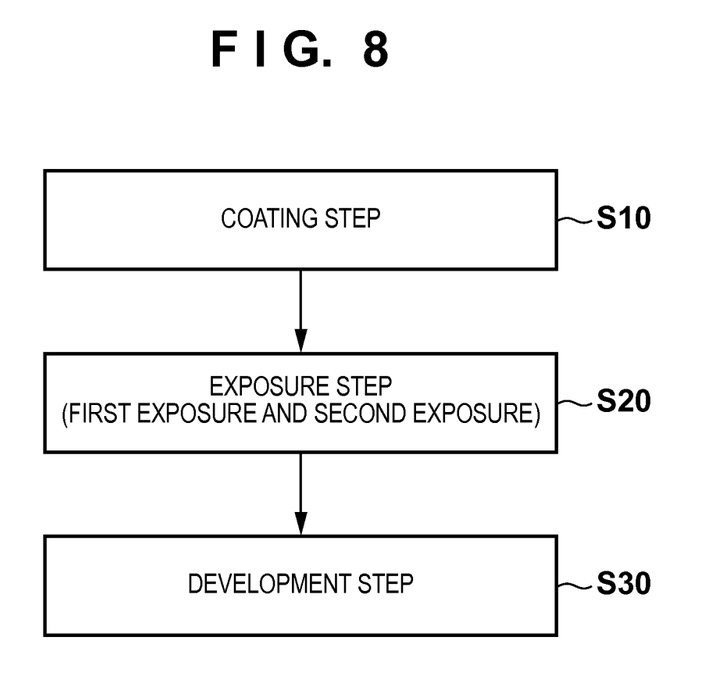
FIG. 8 is a flowchart showing a lithography step.

The photolithography step can include coating step S10 in which a substrate is coated with a photoresist to form a photoresist film on it, exposure step S20 in which the photoresist film is exposed by an exposure apparatus, and development step S30 in which the photoresist film is developed, as shown in FIG. 8. Note that the exposure apparatus used in exposure step S20 typically projects the pattern of a photomask onto the substrate at a predetermined projection magnification (for example, ¼ or ⅕). Exposure step S20 includes first exposure and second exposure, in which the first region 20 and second region 30, respectively, as a plurality of regions in each chip region on a substrate for manufacturing the semiconductor device 1 are exposed. One chip region corresponds to one semiconductor device 1. First exposure and second exposure are performed individually. The order of first exposure and second exposure can be determined arbitrarily. A resist pattern is formed upon development step S30. A circuit pattern can be formed by etching a layer under the resist using the resist pattern as an etching mask. Alternatively, a semiconductor region can be formed by implanting ions into the substrate using the resist pattern as an ion implantation mask.

Figure 1B:
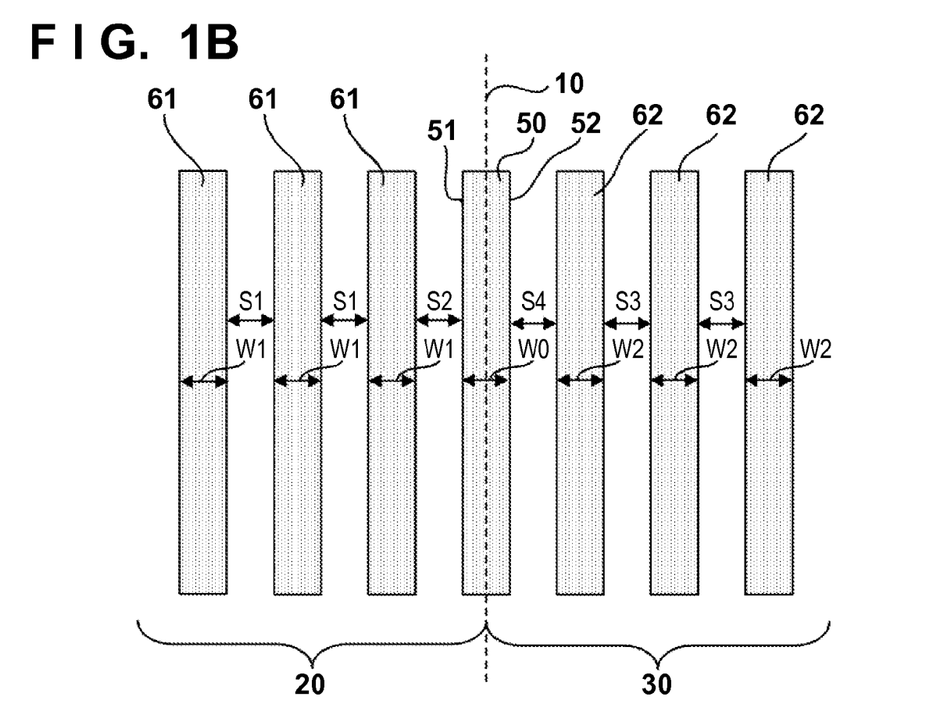

FIG. 1B is an enlarged view of a region including the boundary line 10 shown in FIG. 1A. The semiconductor device 1 includes an on-boundary-line line portion 50, a plurality of first line portions 61, and a plurality of second line portions 62. The on-boundary-line line portion 50, the plurality of first line portions 61, and the plurality of second line portions 62 can be formed by etching an electrically conductive line, formed on the substrate, using, as an etching mask, the resist pattern formed in the above-mentioned photolithography step. The on-boundary-line line portion 50 has a width W0 defined by a first line 51 which is arranged in the first region 20 and is parallel to the boundary line 10, and a second line 52 which is arranged in the second region 30 and is parallel to the boundary line 10. The first line portions 61 are arranged in the first region 20 and are parallel to the on-boundary-line line portion 50. The second line portions 62 are arranged in the first region 20 and are parallel to the on-boundary-line line portion 50. The on-boundary-line line portion 50, the plurality of first line portions 61, and the plurality of second line portions 62 may wholly or partially form part of a line having a curved portion. The on-boundary-line line portion 50 can be at least part of one of a signal line, a shield line, a ground line, and a power supply line.

The first line 51 which defines the on-boundary-line line portion 50 is defined by first exposure in which the first region 20 is exposed, while the second line 52 which defines the on-boundary-line line portion 50 is defined by second exposure in which the second region 30 is exposed. The boundary line 10 passes between the first line 51 and the second line 52, for example, passes through the central line between the first line 51 and the second line 52. Hence, a space S2 between the on-boundary-line line portion 50 and a first line portion 61 closest to the on-boundary-line line portion 50 among the plurality of first line portions 61 is defined by first exposure. Similarly, a space S4 between the on-boundary-line line portion 50 and a second line portion 62 closest to the on-boundary-line line portion 50 among the plurality of second line portions 62 is defined by second exposure. A space S1 between adjacent first line portions 61 of the plurality of first line portions 61 is defined by first exposure, while a space S3 between adjacent second line portions 62 of the plurality of second line portions 62 is defined by second exposure, as a matter of course.

Therefore, according to the first embodiment, the spaces S1, S2, S3, and S4 between adjacent line portions are independent of the alignment accuracy (excluding the accuracy associated with the projection magnification) in first exposure, and that in second exposure. This means that even if a resist pattern defined in first exposure and that defined in second exposure have shifted from each other, the spaces S1, S2, S3, and S4 between adjacent line portions are independent of the shift. This makes it possible to reduce a variation in capacitance between adjacent line portions, including, for example, line portions in regions near the boundary line 10.

Figure 2A:
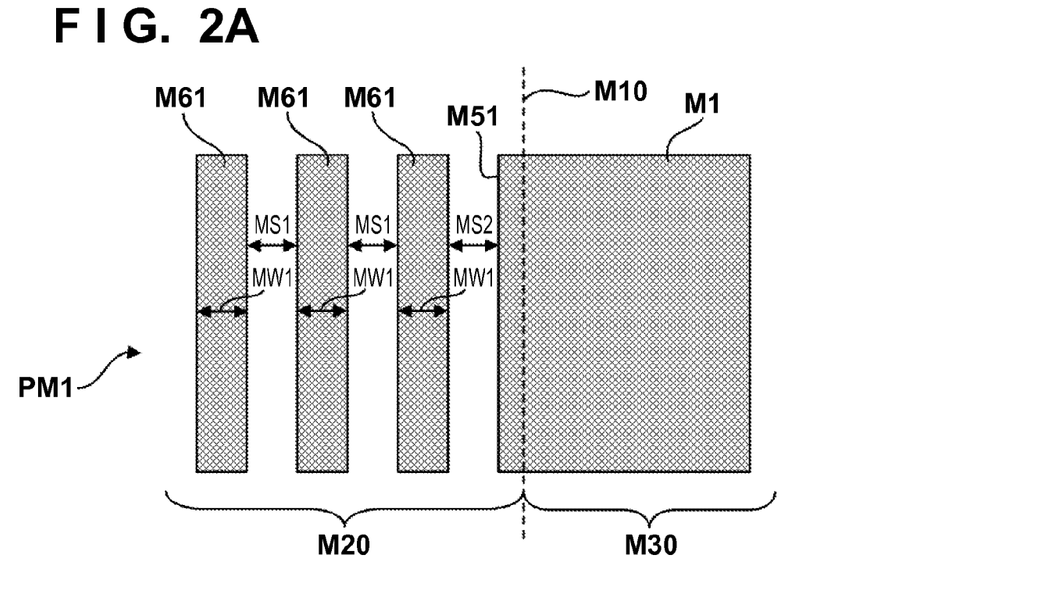
FIGS. 2A and 2B are views illustrating photomasks used to manufacture a semiconductor device according to the first embodiment.
Figure 2B:
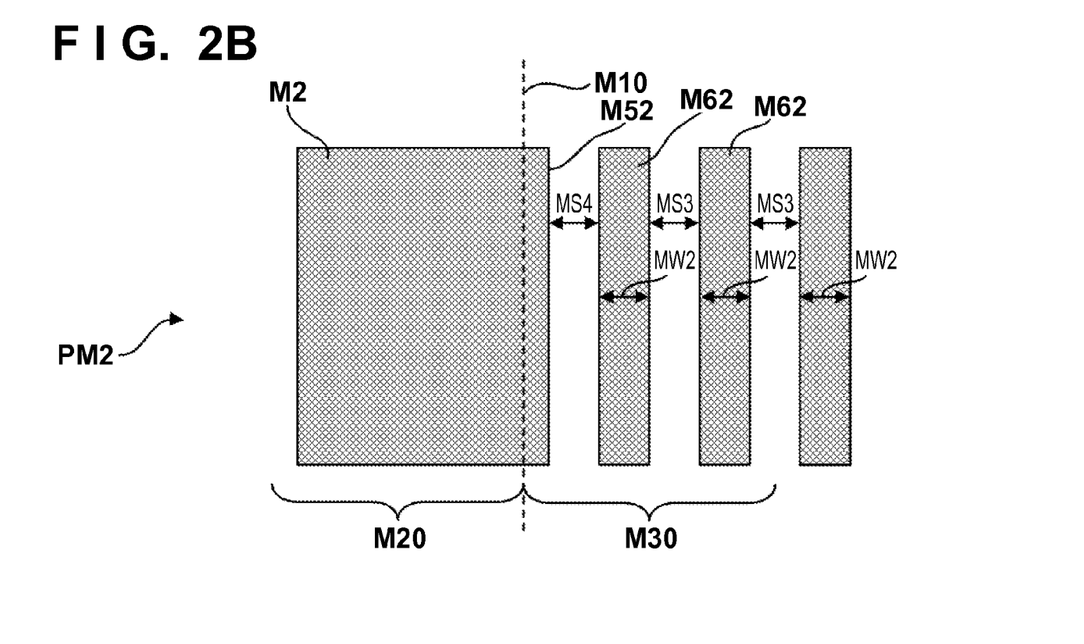

FIG. 2A illustrates the first photomask PM1 used for first exposure in which the first region 20 is exposed, and FIG. 2B illustrates the second photomask PM2 used for second exposure in which the second region 30 is exposed. Although the case wherein the photoresist used serves as a positive photoresist will be exemplified herein, the present invention is also applicable to the case wherein a negative photoresist is used. However, when a negative photoresist is used, a region corresponding to the on-boundary-line line portion 50 in the negative photoresist is partially exposed twice. Hence, when a negative photoresist is used, correction may be added.

The first photomask PM1 includes a plurality of first line portions M61 for defining the plurality of first line portions 61, respectively, and a light-shielding portion M1 having a first edge M51 which defines the first line 51. The second photomask PM2 includes a plurality of second line portions M62 for defining the plurality of second line portions 62, respectively, and a light-shielding portion M2 having a second edge M52 which defines the second line 52. Note that a boundary line M10 corresponds to the boundary line 10 in the semiconductor device 1, a region M20 corresponds to the first region 20 in the semiconductor device 1, and a region M30 corresponds to the portion of the second region 30 near the boundary line 10 in the semiconductor device 1.

A width MW1 of each first line portion M61 corresponds to a width W1 of each first line portion 61 in the semiconductor device 1, and a width WW1 of a first line portion W61 in a resist pattern for forming the first line portion 61. A space MS1 between adjacent first line portions M61 of the plurality of first line portions M61 corresponds to the space S1 between adjacent first line portion portions 61 in the semiconductor device 1, and a space WS1 between adjacent first line portions W61 in a resist pattern for forming the first line portions 61. A space MS2 between the first edge M51 and a first line portion M61 closest to the first edge M51 among the plurality of first line portions M61 corresponds to the space S2 between the on-boundary-line line portion 50 and a first line portion 61 closest to the on-boundary-line line portion 50 in the semiconductor device 1. The space MS2 also corresponds to a space WS2 in the resist pattern. The resist pattern will be described in detail later with reference to FIG. 4.

A width MW2 of each second line portion M62 corresponds to a width W2 of each second line portion 62 in the semiconductor device 1, and a width WW2 of a second line portion W62 in a resist pattern for forming the second line portion M62. A space MS3 between adjacent second line portions M62 of the plurality of second line portions M62 corresponds to the space S3 between adjacent second line portions 62 in the semiconductor device 1, and a space WS3 between adjacent second line portions W62 in a resist pattern for forming the second line portions M62. A space MS4 between the second edge M52 and a second line portion M62 closest to the second edge M52 among the plurality of second line portions M62 corresponds to the space S4 between the on-boundary-line line portion 50 and a second line portion 62 closest to the on-boundary-line line portion 50 in the semiconductor device 1. The space MS4 also corresponds to a space WS4 in the resist pattern.

Figure 3A:
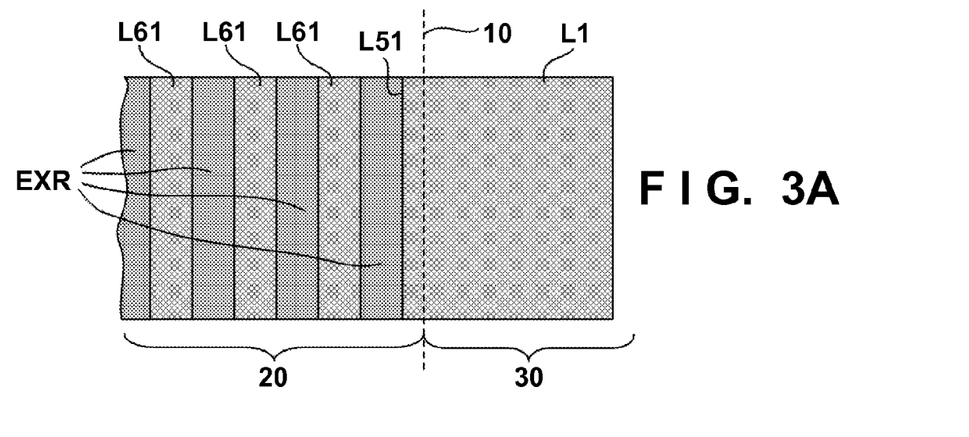
FIGS. 3A to 3C are views illustrating latent images formed on photoresists in the first embodiment.
Figure 3B:
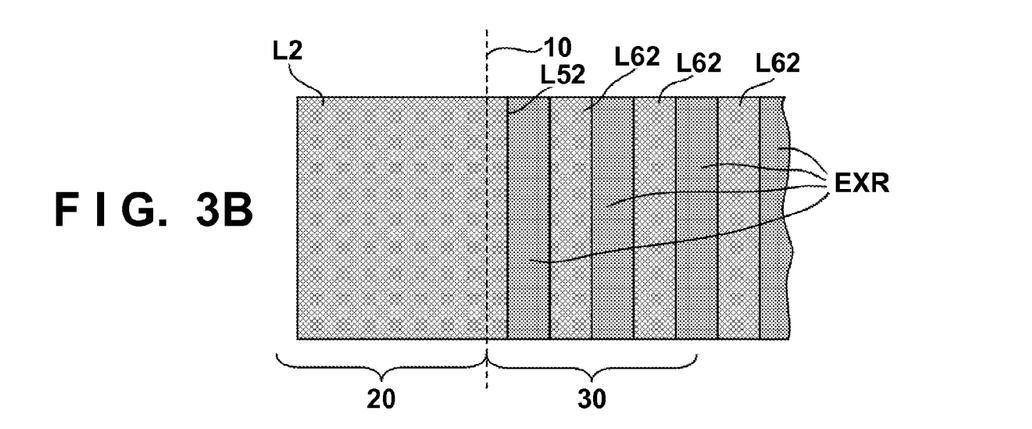
Figure 3C:
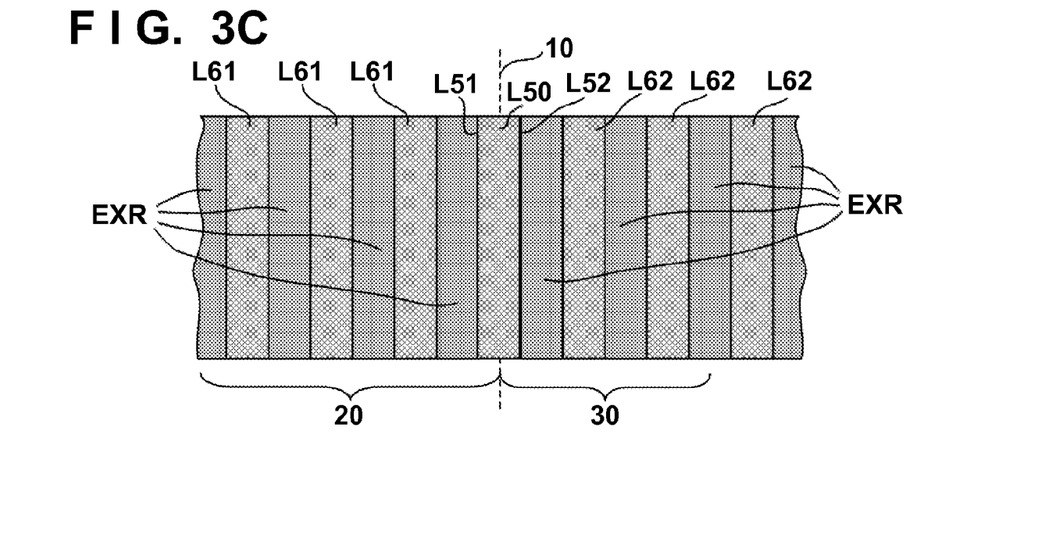

FIG. 3A schematically shows a latent image formed on the photoresist by exposing the first region 20 using the first photomask PM1 (first exposure). FIG. 3B schematically shows a latent image formed on the photoresist by exposing the second region 30 using the second photomask PM2 (second exposure). FIG. 3C schematically shows a latent image formed on the photoresist by first exposure and second exposure. Reference numerals L50, L61, L62, L51, and L52 in the latent image correspond to the on-boundary-line line portion 50, first line portions 61, second line portions 62, first line 51, and second line 52, respectively, in the semiconductor device 1. Also, reference numerals L50, L61, L62, L51, and L52 in the latent image correspond to an on-boundary-line line portion W50, the first line portion W61, the second line portion W62, a first line W51, and a second line W52, respectively, in the resist pattern. Reference numerals L1 and L2 in the latent image correspond to the light-shielding portion M1 in the first photomask PM1, and the light-shielding portion M2 in the second photomask PM2, respectively. Reference symbols EXR in FIGS. 3A, 3B, and 3C denote exposed regions. A resist pattern is formed by developing the latent image in a development step.

Figure 4:
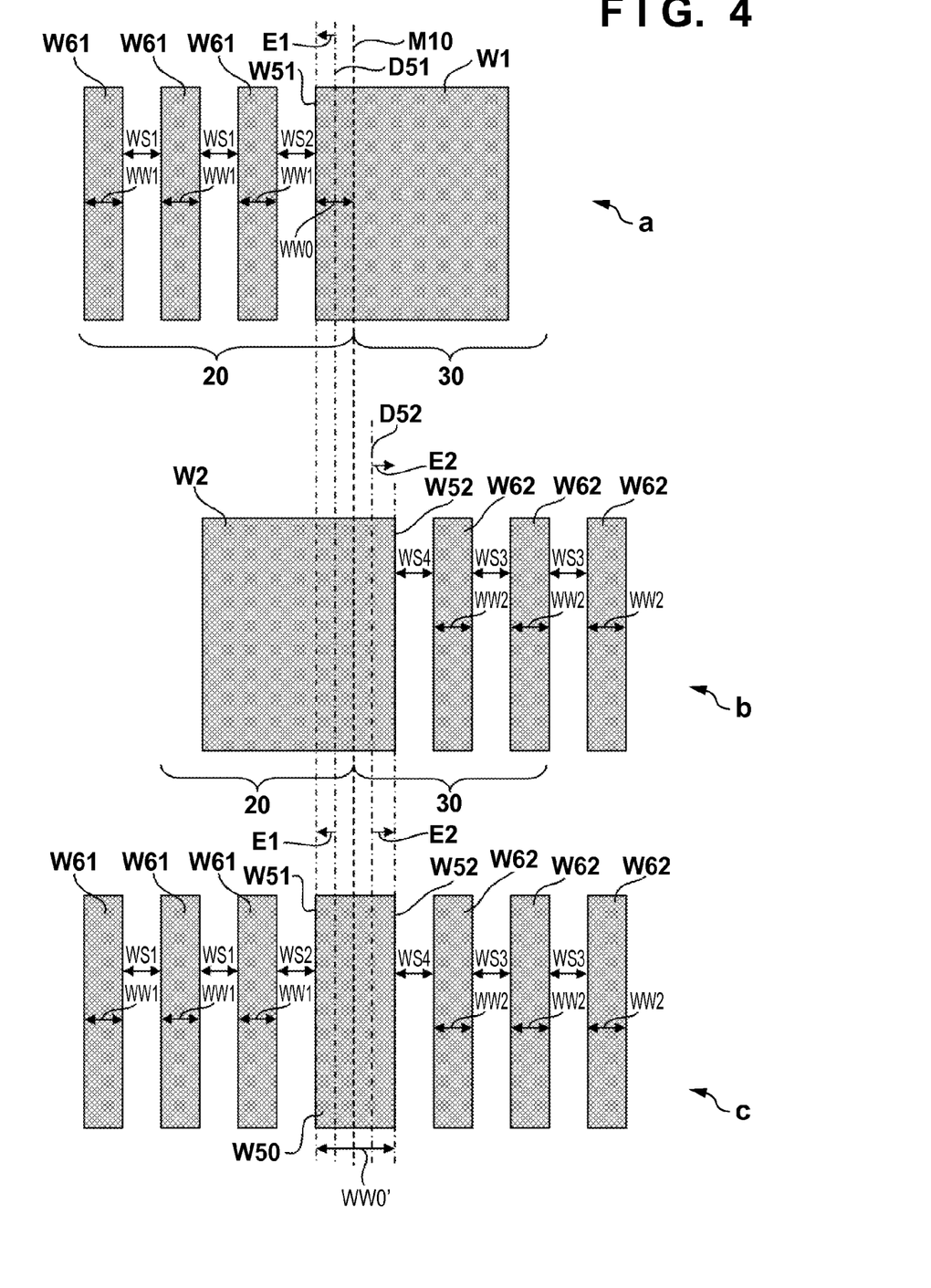
FIG. 4 illustrates views of formed resist patterns.

In FIG. 4, a, b and c show resist patterns formed after a development step. a in FIG. 4 schematically shows a resist pattern developed upon exposure using the first photomask PM1. b in FIG. 4 schematically shows a resist pattern developed upon exposure using the second photomask PM2. c in FIG. 4 schematically shows a resist pattern developed upon exposure using the first photomask PM1 and second photomask PM2. In FIG. 4, a, b and c schematically show how an alignment error E1 has occurred in first exposure which uses the first photomask PM1, and an alignment error E2 has occurred in second exposure which uses the second photomask PM2. Note that the direction in which a width WW0 (width W0) of the on-boundary-line line portion W50 (on-boundary-line line portion 50) increases is defined as the positive direction. Letting WW0 be the design width of the on-boundary-line line portion W50 (on-boundary-line line portion 50), and WW0' be the on-boundary-line line portion W50 in the formed resist pattern, WW0'=WW0+E1+E2. In contrast to the example illustrated in FIG. 4, the width of the on-boundary-line line portion W50 often becomes smaller than its design width due to the alignment errors E1 and E2.

In the semiconductor device 1 manufactured in the abovementioned way, the manufacturing variations in spaces S1, S2, S3, and S4 are smaller than that in width W0 of the on-boundary-line line portion 50. This may reduce a manufacturing error of the capacitance between the line portions. Note that a solid-state image sensor in one example can be manufactured as the spaces S1, S2, S3, and S4 are designed to be equal to each other.

The second embodiment will be described below with reference to FIGS. 5A, 5B, 6A, 6B, and 7A to 7C. Note that details which are not particularly referred to in the second embodiment can be the same as in the first embodiment. Reference numerals including primes (') among reference numerals in FIGS. 5A, 5B, 6A, 6B, and 7A to 7C correspond to those including no primes among reference numerals in FIGS. 1A, 1B, 2A, 2B, 3A to 3C, and 4.

Figure 5A:
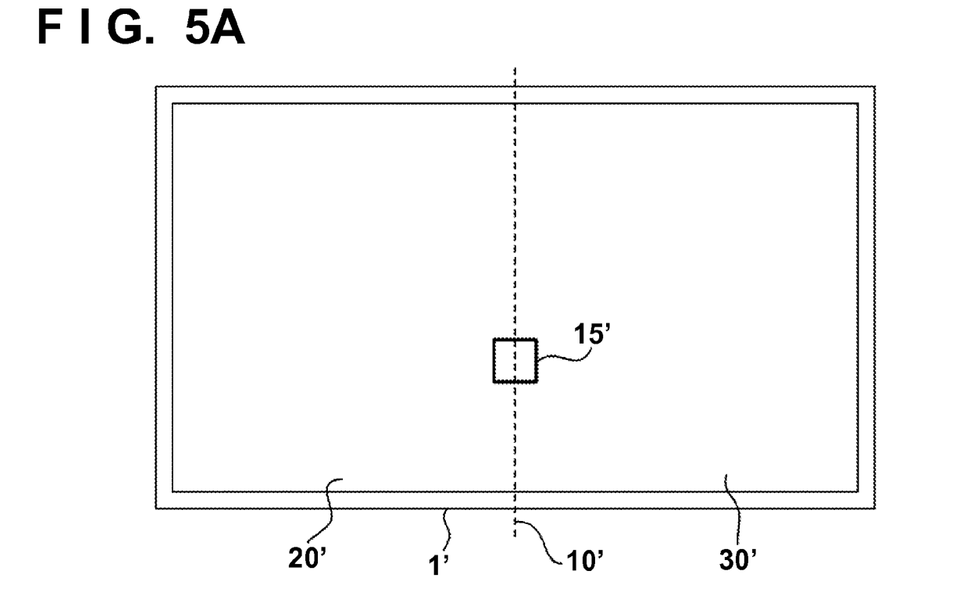
FIGS. 5A and 5B are plan views illustrating the configuration of a semiconductor device according to the second embodiment.
Figure 5B:
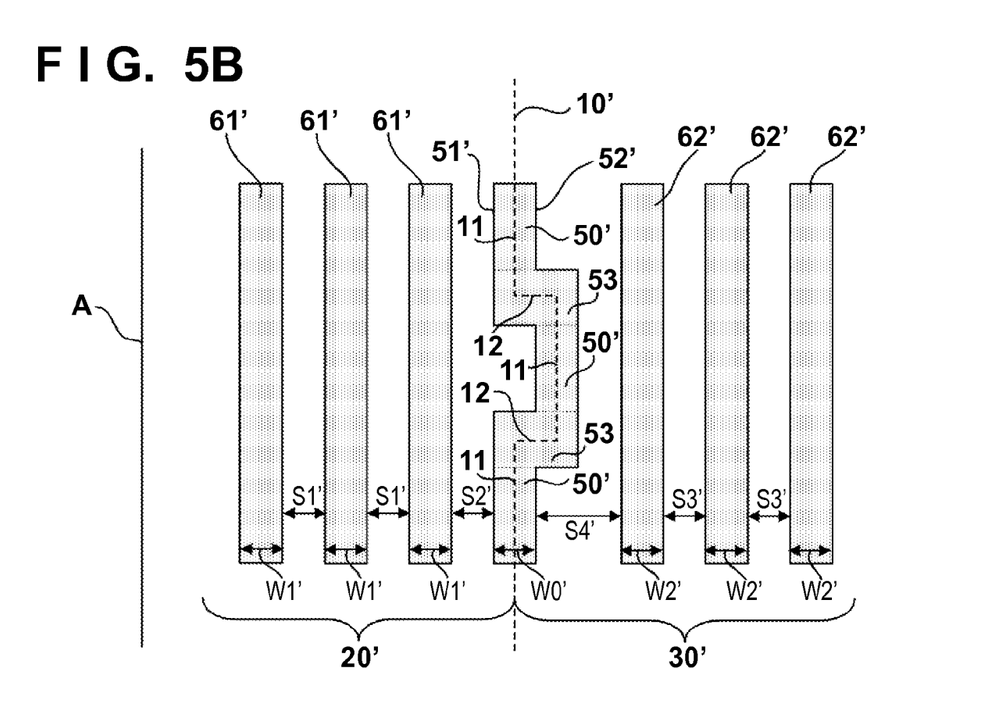
Figure 6A:
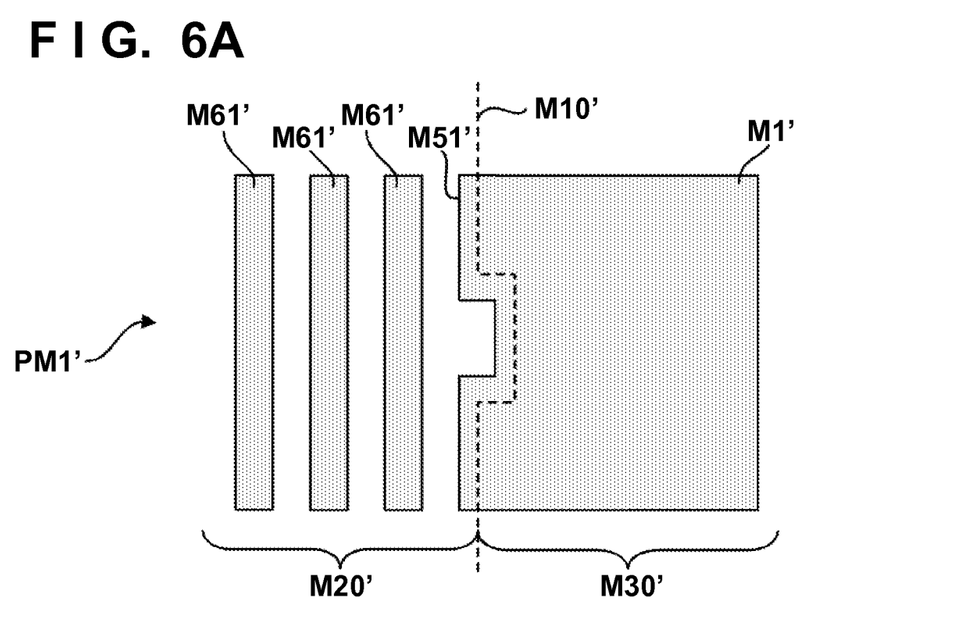
FIGS. 6A and 6B are views illustrating photomasks used to manufacture a semiconductor device according to the second embodiment.
Figure 6B:
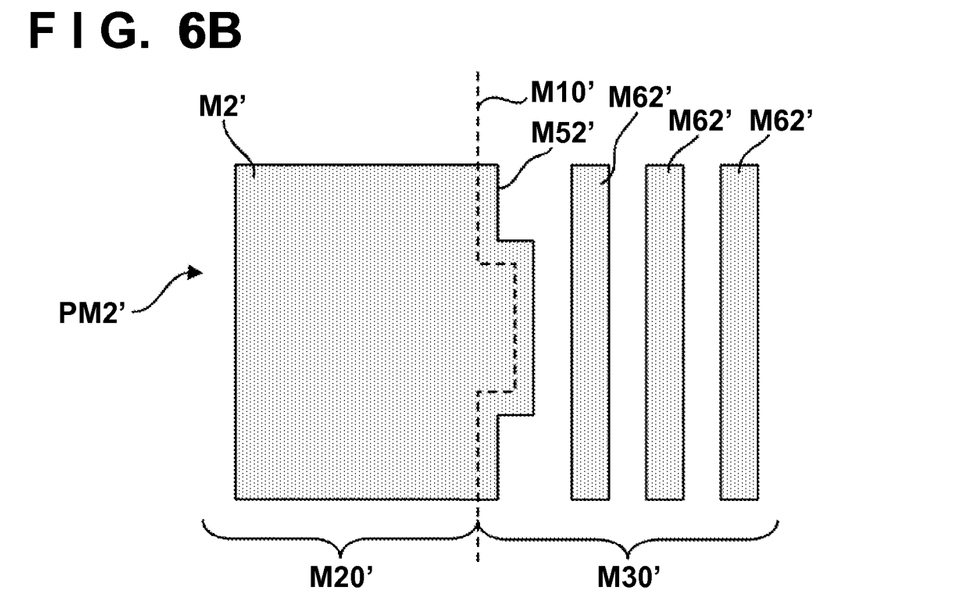

FIG. 5A is a plan view showing the configuration of a semiconductor device (for example, a semiconductor chip) 1' according to the second embodiment of the present invention. FIG. 5B is an enlarged view of a region including a boundary line 10' shown in FIG. 5B. FIG. 6A illustrates a first photomask PM1' used for first exposure in which a first region 20' is exposed, and FIG. 6B illustrates a second photomask PM2' used for second exposure in which a second region 30' is exposed. The semiconductor device 1' includes, as a plurality of regions, a first region 20' and second region 30' which are adjacent to each other on the boundary line 10'. The first region 20' is exposed using the first photomask PM1' in a photolithography step for manufacturing the semiconductor device 1'. The second region 30' is exposed using the second photomask PM2' in the photolithography step. Note that the first photomask PM1' and second photomask PM2' may be formed on different members or in different regions on one member.

The boundary line 10' includes a plurality of straight line portions 11 parallel to a straight line A along a predetermined direction, and a connecting portion 12 which connects adjacent straight line portions 11 of the plurality of straight line portions 11 to each other. The semiconductor device 1' includes a plurality of on-boundary-line line portions 50'. One on-boundary-line line portion 50' corresponds to one straight line portion 11. Each on-boundary-line line portion 50' has a width defined by a first line 51' which is arranged in the first region 20' and is parallel to the boundary line 10', and a second line 52' which is arranged in the second region 30' and is parallel to the boundary line 10'.

Figure 7A:
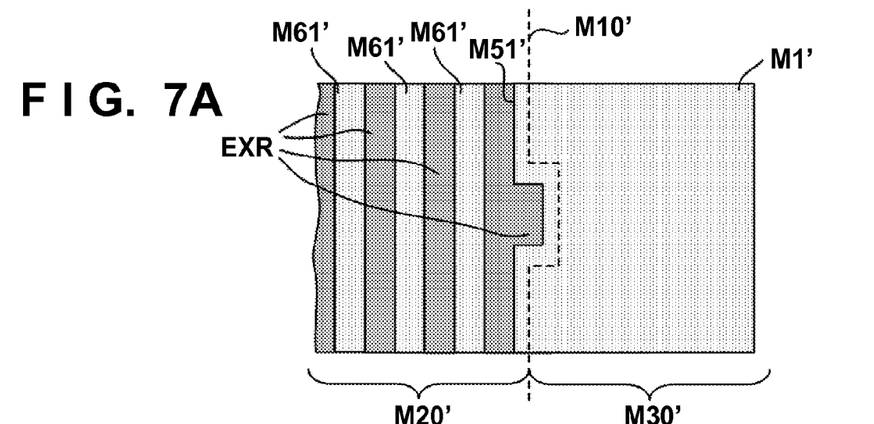
FIGS. 7A to 7C are views illustrating latent images formed on photoresists in the second embodiment.
Figure 7B:
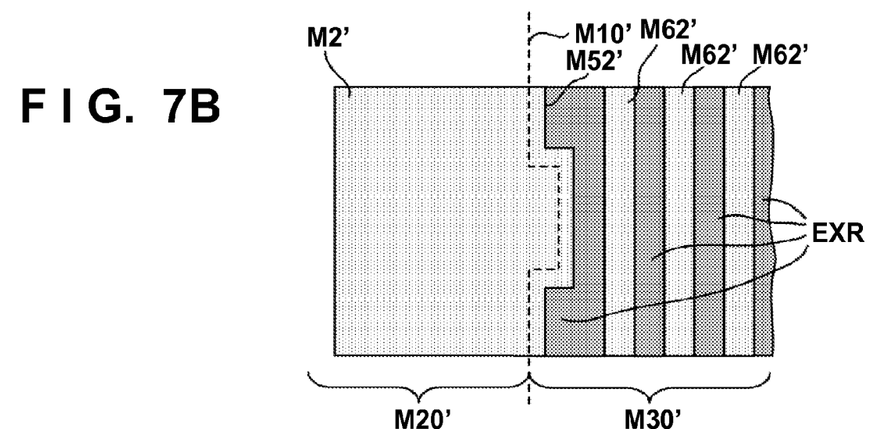
Figure 7C:
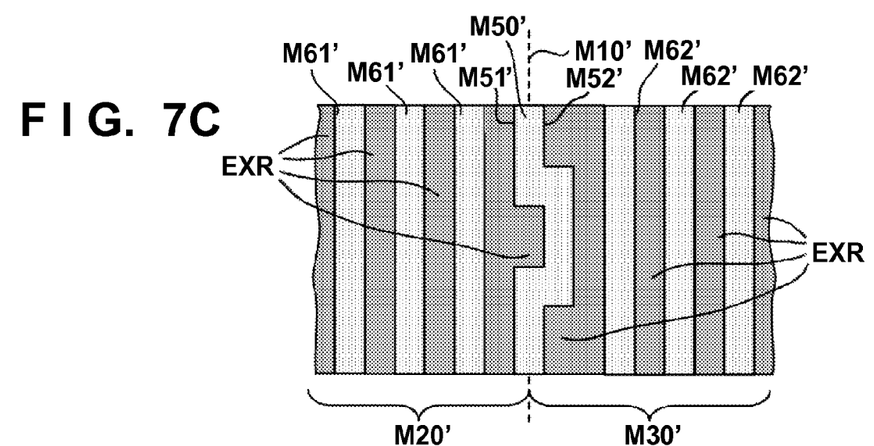

FIG. 7A schematically shows a latent image formed on the photoresist by exposing the first region 20' using the first photomask PM1' (first exposure). FIG. 7B schematically shows a latent image formed on the photoresist by exposing the second region 30' using the second photomask PM2' (second exposure). FIG. 7C schematically shows a latent image formed on the photoresist by first exposure and second exposure.

In the semiconductor device 1' according to the second embodiment, the manufacturing variations in spaces S1', S2', S3', and S4' are smaller than that in width W0 of each on-boundary-line line portion 50'. This may reduce a manufacturing error of the capacitance between the line portions. Note that a solid-state image sensor in one example can be manufactured as the spaces S1', S2', S3', and S4' are designed to be equal to each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-044300, filed Feb. 29, 2012, which is hereby incorporated by reference herein in its entirety.

What is claimed is:

1. A method of manufacturing a semiconductor device including a layer having a first region and a second region contacting the first region at a boundary line between the first region and the second region, the layer within the first region including a plurality of first patterns and the layer within the second region including a plurality of second patterns, the method comprising:

forming a pattern including an on-boundary-line line portion with a width defined by a first line which is arranged in the first region and is parallel to the boundary line, and a second line which is arranged in the second region and is parallel to the boundary line, wherein the first region includes a first area that is an entire area within an outer boundary of a region in which the plurality of first patterns and the first line are to be arranged, and the second region includes a second area that is an entire area within an outer boundary of a region in which the plurality of second patterns and the second line are to be arranged, and wherein the first area and the second area have no area shared by the first area and the second area, the forming the pattern including
individually performing, for a photoresist applied on a substrate, first exposure for defining the first line using a first photomask that includes first portions for forming the plurality of first patterns and a first light-shielding portion having a first edge defining the first line and light-shielding the second area, and second exposure for defining the second line using a second photomask that includes second portions for forming the plurality of second patterns and a second light-shielding portion having a second edge defining the second line and light-shielding the first area, and developing the photoresist that has undergone the individually-performed first exposure and second exposure.

2. The method according to claim 1, wherein
the plurality of first patterns includes a plurality of first line portions parallel to the on-boundary-line line portion, and the plurality of second patterns includes a plurality of second line portions parallel to the on-boundary-line line portion.

3. The method according to claim 2, wherein a space between adjacent first line portions of the plurality of first line portions, a space between the on-boundary-line line portion and a first line portion closest to the on-boundary-line line portion among the plurality of first line portions, a space between adjacent second line portions of the plurality of second line portions, and a space between the on-boundary-line line portion and a second line portion closest to the on-boundary-line line portion among the plurality of second line portions are equal to each other.

4. The method according to claim 1, wherein
the boundary line includes a first straight line portion running on a first straight line, and a second straight line portion running on a second straight line parallel to the first straight line, and a connecting portion which runs along a direction intersecting with the first straight line and the second straight line and which connects the first straight line portion and the second straight line portion, and the semiconductor device includes a plurality of on-boundary-line line portions provided on the first straight line portion and the second straight line portion in a one-to-one correspondence.

5. The method according to claim 1, wherein the photoresist serves as a positive photoresist.

6. The method according to claim 1, wherein the photoresist serves as a negative photoresist.

7. A method of manufacturing a semiconductor device including a layer having a first region and a second region contacting the first region at a boundary line between the first region and the second region, the layer within the first region including a plurality of first patterns and the layer within the second region including a plurality of second patterns, the method comprising:

forming a pattern including an on-boundary-line line portion with a width defined by a first line which is arranged in the first region, and a second line which is arranged in the second region, wherein the first region includes a first area that is an entire area within an outer boundary of a region in which the plurality of first patterns and the first line are to be arranged, and the second region includes a second area that is an entire area within an outer boundary of a region in which the plurality of second patterns and the second line are to be arranged, and wherein the first area and the second area have no area shared by the first area and the second area, the forming the pattern including
individually performing, for a photoresist applied on a substrate, first exposure for defining the first line using a first photomask that includes first portions for forming the plurality of first patterns and a first light-shielding portion having a first edge defining the first line and light-shielding the second area, and second exposure for defining the second line using a second photomask that includes second portions for forming the plurality of second patterns and a second light-shielding portion having a second edge defining the second line and light-shielding the first area, and
developing the photoresist that has undergone the individually-performed exposure and second exposure.

* * * * *